(12) United States Patent
Kobernik et al.

(10) Patent No.: US 12,209,579 B2
(45) Date of Patent: Jan. 28, 2025

(54) GAS JET DEFLECTION IN PRESSURIZED SYSTEMS

(71) Applicant: SHINE TECHNOLOGIES, LLC, Janesville, WI (US)

(72) Inventors: Arne V. Kobernik, Madison, WI (US); Brandon A. Jackson, Madison, WI (US); Thomas C. Bonde, Madison, WI (US); Tye Gribb, Madison, WI (US); Ross F. Radel, Madison, WI (US)

(73) Assignee: SHINE Technologies, LLC, Janesville, WI (US)

( * ) Notice: Subject to any disclaimer, the term of this patent is extended or adjusted under 35 U.S.C. 154(b) by 0 days.

(21) Appl. No.: 18/659,787

(22) Filed: May 9, 2024

(65) Prior Publication Data

US 2024/0295213 A1    Sep. 5, 2024

Related U.S. Application Data (63) Continuation of application No. 18/466,294, filed on Sep. 13, 2023, now Pat. No. 12,049,883, which is a
(Continued)

(51) Int. Cl.
*H01J 37/147* (2006.01)
*F04B 37/16* (2006.01)

(52) U.S. Cl.
CPC ............ *F04B 37/16* (2013.01); *H01J 37/147* (2013.01); *H01J 2237/15* (2013.01)

(58) Field of Classification Search
CPC ....... H01J 37/147; H01J 37/16; H01J 2237/15
See application file for complete search history.

(56) References Cited

U.S. PATENT DOCUMENTS

| 3,778,655 A | 12/1973 | Luce |
| 5,270,542 A | 12/1993 | McMurry et al. |

(Continued)

FOREIGN PATENT DOCUMENTS

| EP | 1670027 | 6/2006 |
| GB | 1012056 | 12/1965 |

OTHER PUBLICATIONS

International Search Report & Written Opinion, International Patent Application No. PCT/US2020/042307, mailed Dec. 21, 2020, 20 pages.
(Continued)

*Primary Examiner* — Joseph L Williams
(74) *Attorney, Agent, or Firm* — CASIMIR JONES, S.C.; Brian F. Bradley (57) ABSTRACT

Provided herein are articles of manufacture, systems, and methods employing a gas-deflector plate in low to ultra-high vacuum systems that use differential pumping (e.g., gas-target particle accelerators, mass spectrometers, and windowless delivery ports). In certain embodiments, the gas-deflector plate is configured to be positioned between higher and lower pressure regions in a pressurized system, wherein the gas-deflector plate has a channel therethrough shaped and/or angled such that jetting gas moving through the channel enters the lower pressure region at an angle offset from the vertical axis of the gas-deflector plate and/or the channel. In other embodiments, a jet-deflector component is employed such that the jetting gas strikes such jet-deflector component and is re-directed in another direction.

20 Claims, 10 Drawing Sheets

Related U.S. Application Data continuation of application No. 16/930,840, filed on Jul. 16, 2020, now Pat. No. 11,795,929.

(60) Provisional application No. 62/876,116, filed on Jul. 19, 2019.

(56) References Cited

U.S. PATENT DOCUMENTS

| | | |
|---|---|---|
| 6,232,709 B1 | 5/2001 | Retsky |
| 9,312,092 B2 | 4/2016 | Aptaker et al. |
| 2004/0227105 A1 | 11/2004 | Benveniste et al. |
| 2009/0045007 A1 | 2/2009 | Counts |
| 2010/0284502 A1 | 11/2010 | Piefer |
| 2012/0090705 A1 | 4/2012 | Newman et al. |
| 2018/0206323 A1 | 7/2018 | Kobernik et al. |

OTHER PUBLICATIONS

Extended European Search Report for application 20844203.8. Mailed May 25, 2023. 7 pages.

GAS JET DEFLECTION IN PRESSURIZED SYSTEMS

CROSS-REFERENCE TO RELATED APPLICATIONS

The present application is a continuation of U.S. patent application Ser. No. 18/466,294, filed on Sep. 13, 2023, which is a continuation of U.S. patent application Ser. No. 16/930,840, filed on Jul. 16, 2020, now U.S. Pat. No. 11,795,929 issued on Oct. 24, 2023, which claims priority to U.S. Provisional application Ser. No. 62/876,116, filed Jul. 19, 2019, which is herein incorporated by reference in its entirety.

FIELD

Provided herein are articles of manufacture, systems, and methods employing a gas-deflector plate in low to ultra-high vacuum systems that use differential pumping (e.g., gas-target particle accelerators, mass spectrometers, electron-beam welding, and windowless delivery ports). In certain embodiments, the gas-deflector plate is configured to be positioned between higher and lower pressure regions in a pressurized system, wherein the gas-deflector plate has a channel therethrough shaped and/or angled such that jetting gas moving through the channel enters the lower pressure region at an angle offset from the vertical axis of the gas-deflector plate and/or the channel. In other embodiments, a jet-deflector component is employed such that the jetting gas strikes such jet-deflector component and is re-directed in another direction.

BACKGROUND

Target designs for particle accelerators can take the form of solid, liquid, or gas/plasma. High pressure gas from the target will naturally flow towards lower pressure portions of the accelerator system where high vacuum is required. Vacuum windows can be used to separate the target material from the high vacuum environment of the beamline while permitting the high energy particles to pass through. In the case of high-flux, continuously operated accelerators the thermal stresses on the window become unmanageable and such an approach is ineffective.

An alternative approach is to focus the beam into the target chamber through a narrow-diameter aperture. To combat this natural transport of gas escaping the target, differential pumping systems are employed composed of pumping stages separated by additional coaxial apertures-permitting pressure ratios in excess of 109 within the beamline. In this approach, high pressure target gas expanding through the target aperture will accelerate while transiting into the adjacent differential pumping stage. In the case of a linear beamline in which all the pumping apertures are coaxial, this phenomenon can result in a considerable portion of the jetting gas to coherently traverse an adjacent pumping stage. Consequently, higher pressures will be propagated further up the course of the beamline and may interfere with beam transport by increasing charge exchange, scatter and/or decreasing the focusing ability and overall effectiveness of the accelerator.

SUMMARY

Provided herein are articles of manufacture, systems, and methods employing a gas-deflector plate that may be combined with an asymmetric nozzle in low to ultra-high vacuum systems that use differential pumping (e.g., gas-target particle accelerators, mass spectrometers, electron beam welding, and windowless delivery ports). In certain embodiments, the gas-deflector plate is configured to be positioned between higher and lower pressure regions in a pressurized system, wherein the gas-deflector plate has a channel therethrough shaped and/or angled such that jetting gas moving through the channel enters the lower pressure region at an angle offset from the vertical axis of the gas-deflector plate and/or the channel. In other embodiments, a jet-deflector component is employed such that the jetting gas strikes such jet-deflector component and is re-directed in another direction.

In some embodiments, provided herein are articles of manufacture comprising: a gas-deflector plate, wherein the gas-deflector plate comprises a top surface, a bottom surface, and a channel extending through the gas-deflector plate, wherein the gas-deflector plate: i) has longitudinal and lateral axes that extend through the gas-deflector plate that are parallel to the top and bottom surfaces, and ii) a vertical axis that is perpendicular to the longitudinal and lateral axes, wherein the gas-deflector plate is configured to be positioned between a higher pressure region and lower pressure region in a pressurized system (e.g., as described in U.S. Pat. No. 8,837,662, herein incorporated by reference in its entirety) such that the top surface faces the lower pressure region and the bottom surface faces the higher pressure region, wherein the channel comprises: i) a top opening in the top surface of the gas-deflector plate, and ii) a bottom opening in the bottom surface of the gas-deflector plate, and wherein the channel is shaped and/or angled such that jetting gas moving through the channel from the higher pressure region to the lower pressure region enters the lower pressure region at an angle offset from the vertical axis.

In certain embodiments, provided herein are systems comprising: a) any of the gas-deflector plates described herein, and b) a jet-deflector component comprising a first surface, wherein the jet-deflector component is configured to be positioned in the lower pressure region such that the jetting gas entering the lower pressure region strikes the first surface and is re-directed in a different direction. In particular embodiments, the first surface has a shape selected from the group of: flat, concave, convex, and textured. In other embodiments, the jet-deflector component further comprises first attachment components (e.g., screws, rods, holes, nuts, etc.), and wherein the gas deflector plate further comprises second attachment components (e.g., screws, rods, holes, nuts, etc.), and wherein the first and second attachment components allow the jet-deflector component to be attached to the gas deflector plate (e.g., using bolts and openings for the bolts).

In some embodiments, provided herein are systems comprising: a) a pressurized sub-system comprising: i) a higher pressure region, and ii) a lower pressure region; and b) a gas-deflector plate, wherein the gas-deflector plate comprises a top surface, a bottom surface, and a channel extending through the gas-deflector plate, wherein the gas-deflector plate: i) has longitudinal and lateral axes that extend through the gas-deflector plate that are parallel to the top and bottom surfaces, and ii) a vertical axis that is perpendicular to the longitudinal and lateral axes, wherein the gas-deflector plate is positioned between the higher pressure region and the lower pressure region such that the top surface faces the lower pressure region and the bottom surface faces the higher pressure region, wherein the channel comprises: i) a top opening in the top surface of the gas-deflector plate, and ii) a bottom opening in the bottom surface of the gas-deflector plate, and wherein the channel is shaped and/or angled such that jetting gas moving through the channel from the higher pressure region to the lower pressure region enters the lower pressure region at an angle offset from the vertical axis. In certain embodiments, the systems further comprise: c) a jet-deflector component comprising a first surface, wherein the jet-deflector component is positioned in the lower pressure region such that the jetting gas entering the lower pressure region strikes the first surface and is re-directed in a different direction.

In other embodiments, provided herein are systems comprising: a) a pressurizable sub-system comprising: i) a first region, and ii) a second region; and b) a gas-deflector plate, wherein the gas-deflector plate comprises a top surface, a bottom surface, and a channel extending through the gas-deflector plate, wherein the gas-deflector plate: i) has longitudinal and lateral axes that extend through the gas-deflector plate that are parallel to the top and bottom surfaces, and ii) a vertical axis that is perpendicular to the longitudinal and lateral axes, wherein the gas-deflector plate is positioned between the first region and the second region such that the top surface faces the second region and the bottom surface faces the first region, wherein the channel comprises: i) a top opening in the top surface of the gas-deflector plate, and ii) a bottom opening in the bottom surface of the gas-deflector plate, and wherein the channel is shaped and/or angled such that jetting gas moving through the channel from the first region to the second region enters the second region at an angle offset from the vertical axis.

In other embodiments, provided herein are methods comprising one or more of: a) positioning a gas-deflector plate between a first region and a second region of a pressurizable system, wherein the gas-deflector plate comprises a top surface, a bottom surface, and a channel extending through the gas-deflector plate, wherein the gas-deflector plate: i) has longitudinal and lateral axes that extend through the gas-deflector plate that are parallel to the top and bottom surfaces, and ii) a vertical axis that is perpendicular to the longitudinal and lateral axes, wherein the gas-deflector plate is positioned between the first region and the second region such that the top surface faces the second region and the bottom surface faces the first region, wherein the channel comprises: i) a top opening in the top surface of the gas-deflector plate, and ii) a bottom opening in the bottom surface of the gas-deflector plate, and b) activating the pressurizable system such that the pressurizable sub-system becomes pressurized and the first region is at a higher pressure than the second region thereby causing jetting gas to move through the channel from the first region to the second region and enter the second region at an angle offset from the vertical axis.

In certain embodiments, no physical component obstructs said jetting gas coming out of said channel into said low pressure area. In certain embodiments, the angle of the jetting gas is at least 5 or 10 degrees offset from the vertical axis (e.g., at least 5 . . . 10 . . . 15 . . . 25 . . . 35 . . . 45 . . . 55 . . . 65 . . . 75 . . . or 85 degrees). In some embodiments, the angle of the channel is offset from the vertical axis at least 5 or 10 degrees (e.g., at least 5 . . . 10 . . . 15 . . . 25 . . . 35 . . . 45 . . . 55 . . . 65 . . . 75 . . . or 85 degrees). In other embodiments, the top opening comprises an asymmetric opening. In further embodiments, the asymmetric opening is formed from first and second portions of the channel, wherein the first portion is across the asymmetric opening from the second portion, and wherein the second portion has a greater angular offset from the vertical axis than the first portion.

In some embodiments, the pressurized system comprises a differential pumping system. In certain embodiments, the pressurized system comprises a particle accelerator system which comprises: i) an ion source, ii) an ion accelerator, iii) a differential pumping system, and iv) a target chamber. In some embodiments, the particle accelerator system comprises some or all of the components of the systems found in U.S. Pat. No. 8,837,662, which is herein incorporated by reference in its entirety. In further embodiments, the gas-deflector plate is configured to be positioned between the target chamber and the differential pumping system. In other embodiments, the target chamber comprises the higher pressure region and the differential pumping system comprises the lower pressure region. In further embodiments, the pressurized system comprises a mass spectrometer. In other embodiments, the mass spectrometer comprises: i) a sample chamber, ii) a differential pressure stage, and iii) an ionization chamber. In some embodiments, the gas-deflector plate is positioned between the sample chamber and the differential pumping stage. In other embodiments, the sample chamber comprises the higher pressure region and the differential pressure stage comprises the lower pressure region.

In certain embodiments, the channel has a diameter of about 2.5-9.0 mm (e.g., 3.5 . . . 4.5 . . . 5.0 . . . 5.5 . . . 6.5 . . . 7.9 . . . 9.0 mm) along most or all of its length. In particular embodiments, the length of the channel is about 4-6 times the diameter of the channel. In certain embodiments, the length of the channel is about 15-35 mm (e.g., 15 . . . 20 . . . 25 . . . or 35 mm). In other embodiments, the top opening has a diameter of about 2 times the diameter of the channel, or about 6-18 mm (e.g., 7 . . . 10 . . . 15 . . . 17 mm). In further embodiments, the gas-deflector plate has a thickness between the top surface and the bottom surface of about 13-40 mm (e.g., 13 . . . 25 . . . 34 . . . or 40 mm). In other embodiments, the gas-deflector plate has a circular or generally circular shape, or square or generally square shape. In other embodiments, most or all of the gas-deflector plate is composed of metal. In further embodiments, the metal is selected from the group consisting of: copper, tungsten, and stainless Steel.

In some embodiments, the gas-deflector plate comprises one or more openings that allow attachment to the higher pressure region and/or the lower pressure region.

In certain embodiments, the jet-deflector component is attached to the top surface of the gas-deflector plate. In other embodiments, the pressurized sub-system is selected from the group consisting of: gas-target particle accelerators, mass spectrometers, and windowless delivery ports. In other embodiments, the higher pressure region comprises a target chamber of a particle accelerator, and the lower pressure region comprises part of a differential pumping system. In certain embodiments, the gas-deflector plate is composed of heat-resistant materials.

DETAILED DESCRIPTION

Provided herein are articles of manufacture, systems, and methods employing a gas-deflector plate in low to ultra-high vacuum systems that use differential pumping (e.g., gas-target particle accelerators, mass spectrometers, and windowless delivery ports). In certain embodiments, the gas-deflector plate is configured to be positioned between higher and lower pressure regions in a pressurized system, wherein the gas-deflector plate has a channel therethrough shaped and/or angled such that jetting gas moving through the channel from the higher pressure region to the lower pressure region enters the lower pressure region at an angle offset from the vertical axis of the gas-deflector plate. In other embodiments, a jet-deflector component is employed such that the jetting gas strikes such jet-deflector component and is re-directed in another direction.

In certain embodiments, the present disclosure provides a gas deflection technique to deflect supersonic jetting in differential pumping applications. In some embodiments, the deflection device is a gas-deflector plate with a channel with an asymmetric aperture. When high pressure gas is expanded through the channel and asymmetric aperture, the resulting gas jet (e.g., supersonic gas jet) gains an off-axis velocity component in the direction of the asymmetry. In particular embodiments, the shape and/or angle of the channel diverts the direction of the gas jet in a differential pumping system, decreasing mass transport to lower pressure sections while reducing pumping requirements to maintain a given stage pressure. In certain embodiments, deflection of the gas jet is further improved with the addition of a jet deflector component positioned in the direction of the aperture asymmetry.

In some embodiments, provided herein are systems, devices, and methods providing a jet deflection technique that mitigates the effects of supersonic and subsonic gas jetting in staged differential pressure applications. In certain embodiments, provided herein are gas-deflector plates that are angled and/or shaped (e.g., with an asymmetric aperture) which are combined with a jet deflector component to direct jetting gas off axis of the plate. In certain embodiments, such gas-deflector plates reduce mass transport between differential pumping stages, thus reducing pumping demands and/or permitting lower base pressures for a given configuration.

In certain embodiments, provided herein are systems, devices, and methods that improves the efficiency in differentially pumped systems. That is, using the systems, devices, and methods herein allows, for example, for greater pressure differential if all things are equal, or allows the same differential pressure using smaller and/or fewer pumps, or allows a greater aperture to exist between the high and low pressure regions. In certain embodiments, the systems, devices, and methods herein allows for larger aperture diameter to be used for a given pumping configuration.

Provided below is a description of certain exemplary embodiments depicted in the figures. It is to be understood that the applications of this invention are not limited to the such exemplary embodiments. Further, in particular embodiments, the gas-deflector plates and jet-deflector components described below are employed in an accelerator system like the ones described in U.S. Pat. No. 8,837,662, which is herein incorporated by reference in its entirety.

Figure 1A:
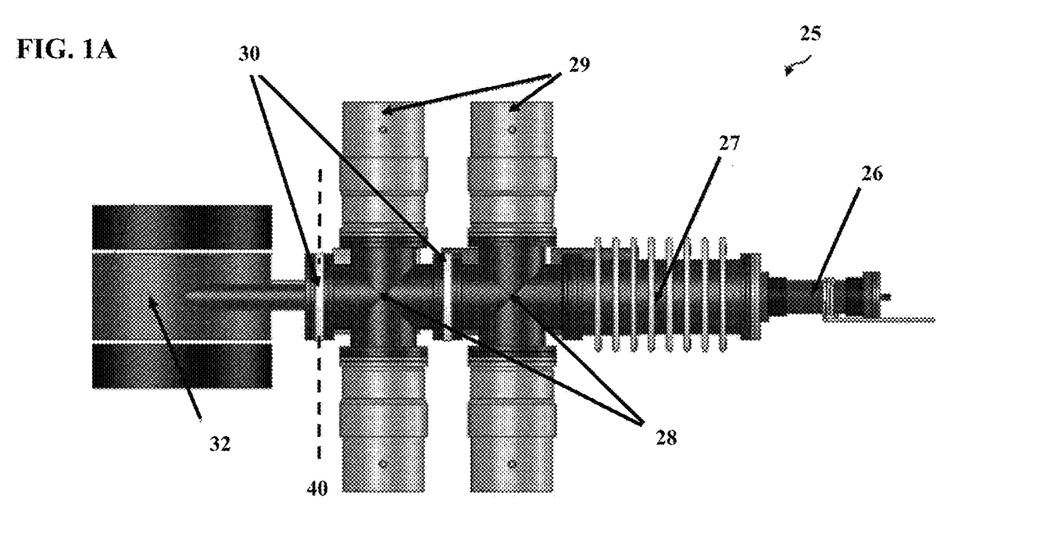
FIG. 1A shows a gas-target particle accelerator with a pair of gas-deflector plates (30) between components with different pressures.

FIG. 1A shows a gas-target particle accelerator (25) with a pair of gas-deflector plates (30) between components with different pressures. An ion source (26) is connected to an accelerator (27), which is connected to a two differential pumping system with two stages (28). Each stage is connected to a vacuum pump (29). A target chamber (32), with an ion confinement magnet (31) therearound, is connected to the differential pumping system with a gas-deflector plate (30) in between. The lateral axis (40) of the gas-deflector plate is shown with a dotted line.

Figure 1B:
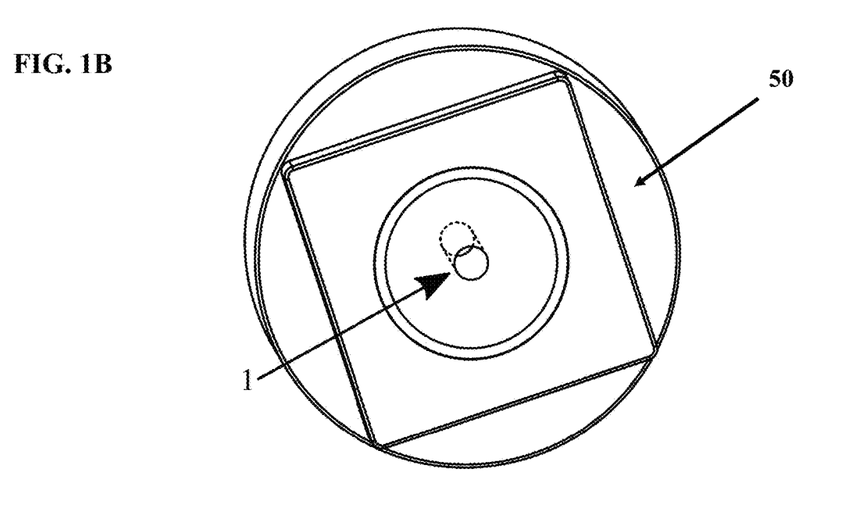
FIG. 1B shows a plate (50) with a uniform channel (1) that is straight through the plate and does not reduce pressure.
Figure 2:
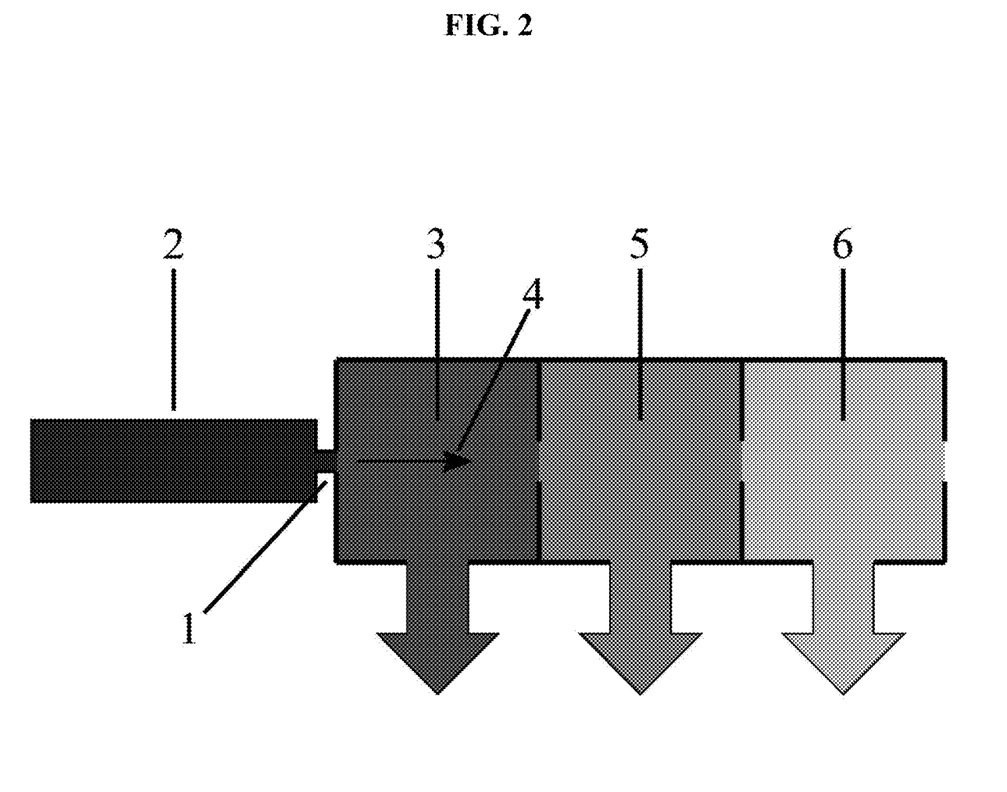
FIG. 2 shows an exemplary schematic of a three-stage differential pumping configuration with a uniform and straight channel (1).

FIG. 1B shows a plate (50) with a uniform channel (1) that is straight through the plate. FIG. 2 shows the use of such a uniform channel (1) positioned between a higher pressure stage (2) and a lower pressure stage (3). As a result of using a uniform channel (1), the gas jet (4) from the higher pressure stage to lower pressure stage is not offset, and instead comes straight into lower pressure stage (3). When an aperture 1 is positioned between two stages of different pressure with stage (2) being at a higher pressure than stage (3), the difference in pressure between the two stages results in a gas flow between the stages that will tend to equalize the pressure in the two stages. Pumps can be employed that counteract this mass flow by transporting the gas escaping into the lower pressure stage back into the higher pressure stage, maintaining a pressure differential. Ultimately, the pressure differential that can be maintained between multiple connected regions depends on the pumping capacity of each region, and the size of the apertures between the two regions. A commonly observed phenomena that reduces the efficacy of coaxial differential pumping systems is the formation of gas jets between regions. If the pressures are sufficiently different between any two stages, the gas coming from the higher pressure region will form a jet as it enters the lower pressure region. The jet is a continuous, coherent, and directional flow of gas that can traverse a given pressure region and emerge in the subsequent pumping stage largely intact. The jet effectively "bypasses" a given pumping stage and, therefore, significantly decreases the efficacy of the differential pumping system. In the case of a three or more-stage system, a considerable portion of the jet can traverse the first differential pumping stage (3), reducing the efficacy of this stage while increasing upstream pressure and pumping requirements in stages (5) and (6).

Such gas jet bypass issues are addressed by the devices, systems, and methods described herein. The function of these devices, systems, and methods is to deflect the gas jet off axis and reduce or destroy its coherence so that the pumps in any given stage can act on the gas. For example, the gas-deflector plates herein with a channel angled or shaped (e.g., with an asymmetric aperture), results in a gas-jet with a velocity component off-axis direction of the aperture axis and/or the gas-deflector plate. This velocity offset, for example, is in the direction of the asymmetry shown by arrow (8) in FIG. 3. The deflection limits the gas that is directly injected into the next differential pumping stage. In some embodiments, multiple configurations of this asymmetric aperture are placed in series between pumping stages to multiply this effect (see FIG. 1A).

Figure 3A:
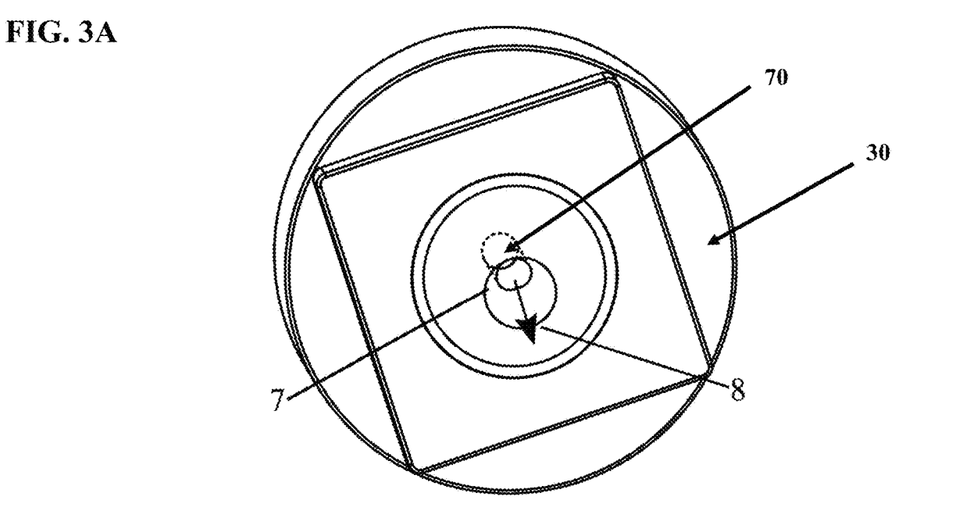
FIG. 3A shows an exemplary gas-deflector plate (30) with a channel (70) with an asymmetric aperture (7) that causes the jetting gas (arrow; 8) to deflect from the vertical axis of the gas-deflector plate.
Figure 3B:
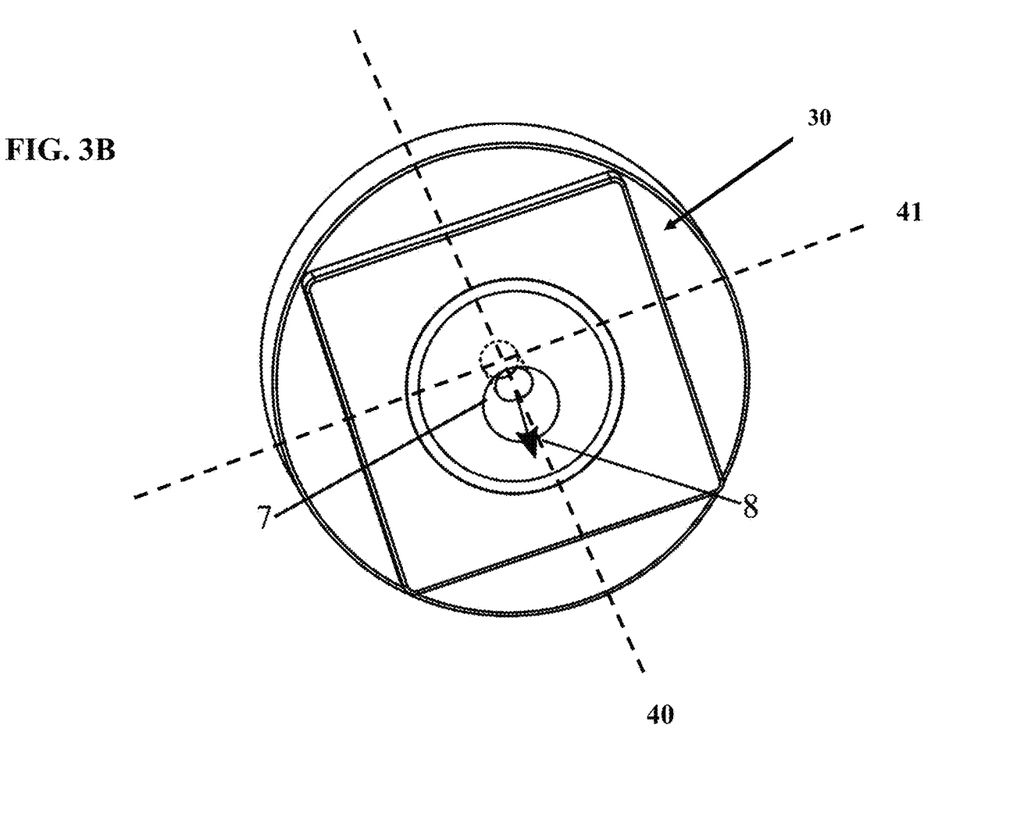
FIG. 3B shows the exemplary gas-deflector plate (30) from FIG. 3A with dotted lines to show the longitudinal axis (40) and lateral axis (41).

FIG. 3A shows an exemplary gas-deflector plate (30) with a channel (70) with an asymmetric aperture (7) that causes the jetting gas (arrow; 8) to deflect from the vertical axis (beam axis) of the gas-deflector plate. FIG. 3B shows the exemplary gas-deflector plate (30) from FIG. 3A with dotted lines to show the longitudinal axis (40) and lateral axis (41). The longitudinal axis and lateral axis are perpendicular to the vertical axis (beam axis).

Figure 4:
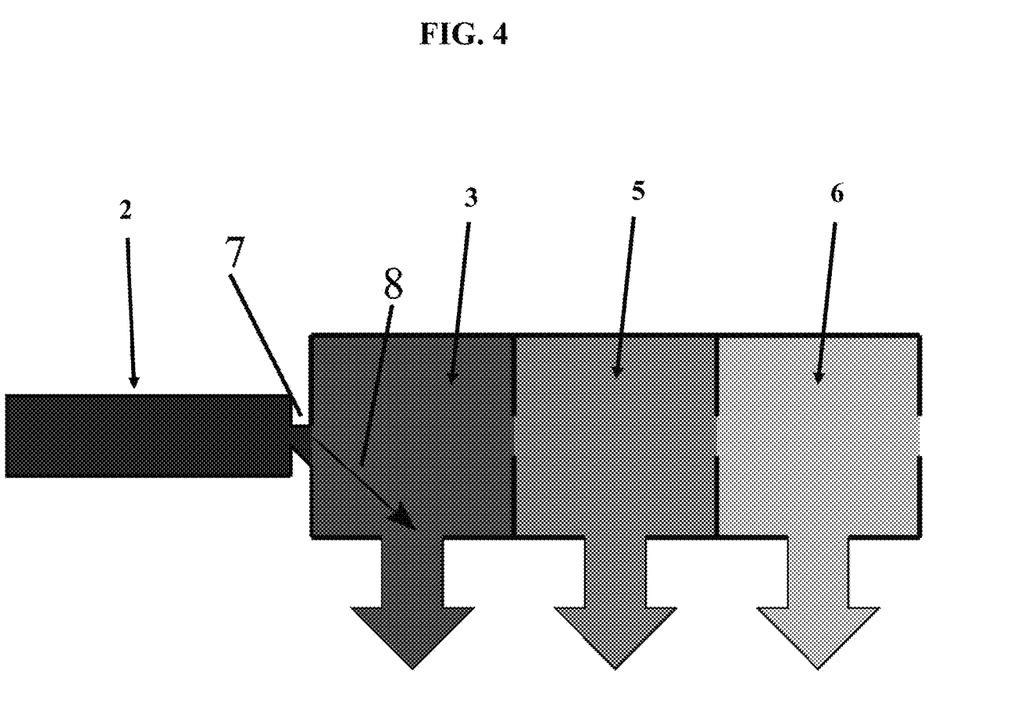
FIG. 4 shows an exemplary schematic of a three-stage differential pumping configuration with an asymmetric aperture (7) that causes jetting gas (arrow; 8) to deflect downwards. In certain embodiments, the asymmetry in the aperture is positioned differently such that the jetting gas is directed upwards, to the left, or to the right.

FIG. 4 shows an exemplary schematic of a three-stage differential pumping configuration with an asymmetric aperture (7) that causes jetting gas (arrow; 8) to deflect downwards away from vertical (beam) axis. Boxes (3), (5), and (6) show differential pumping stages. Stage (2) is a higher pressure stage than stages (3), (5), and (6).

Figure 5A:
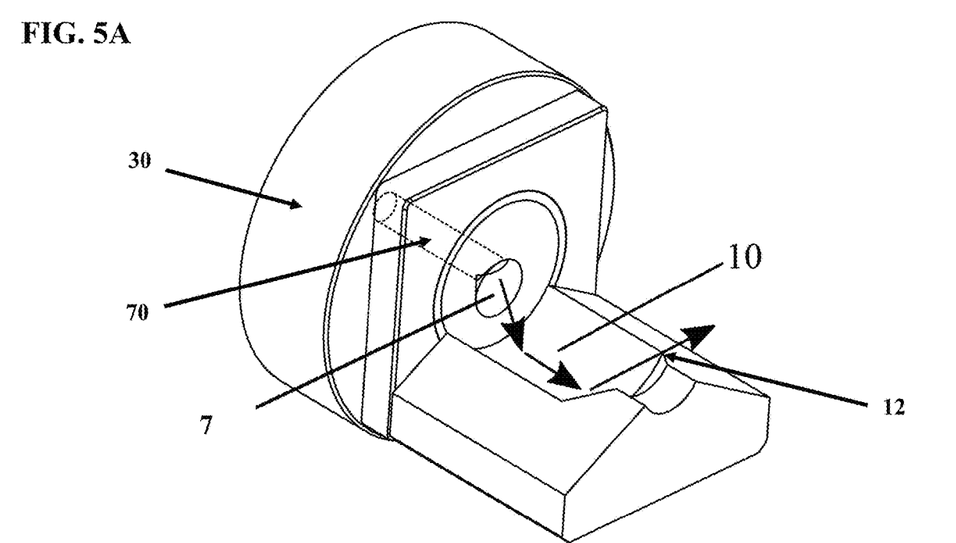
FIG. 5A shows an exemplary gas-deflector plate with an asymmetric aperture (7) that causes the jetting gas (arrow; 8) to deflect from the vertical axis. The jetting gas hits a jet deflector (10) causing the jetting gas to deflect to a different direction (arrow; 12).
Figure 5B:
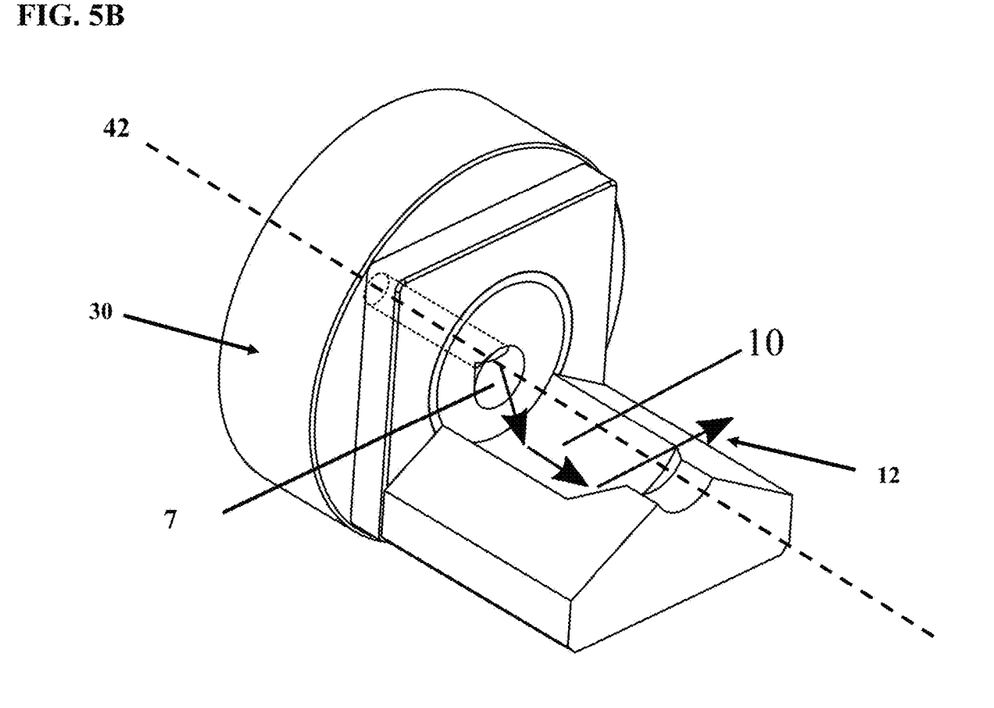
FIG. 5B shows the exemplary gas-deflector plate (30) from FIG. 5A with dotted lines to show the vertical axis (42).

FIG. 5A shows an exemplary gas-deflector plate with a channel (70) with an asymmetric aperture (7) that causes the jetting gas (arrow; 8) to deflect from the vertical axis (beam axis). The jetting gas hits a jet deflector component (10) causing the jetting gas to deflect to a different direction (arrow; 12). FIG. 5B shows the exemplary gas-deflector plate (30) from FIG. 5A with dotted lines to show the vertical axis (42) (aka "beam axis").

Figure 6:
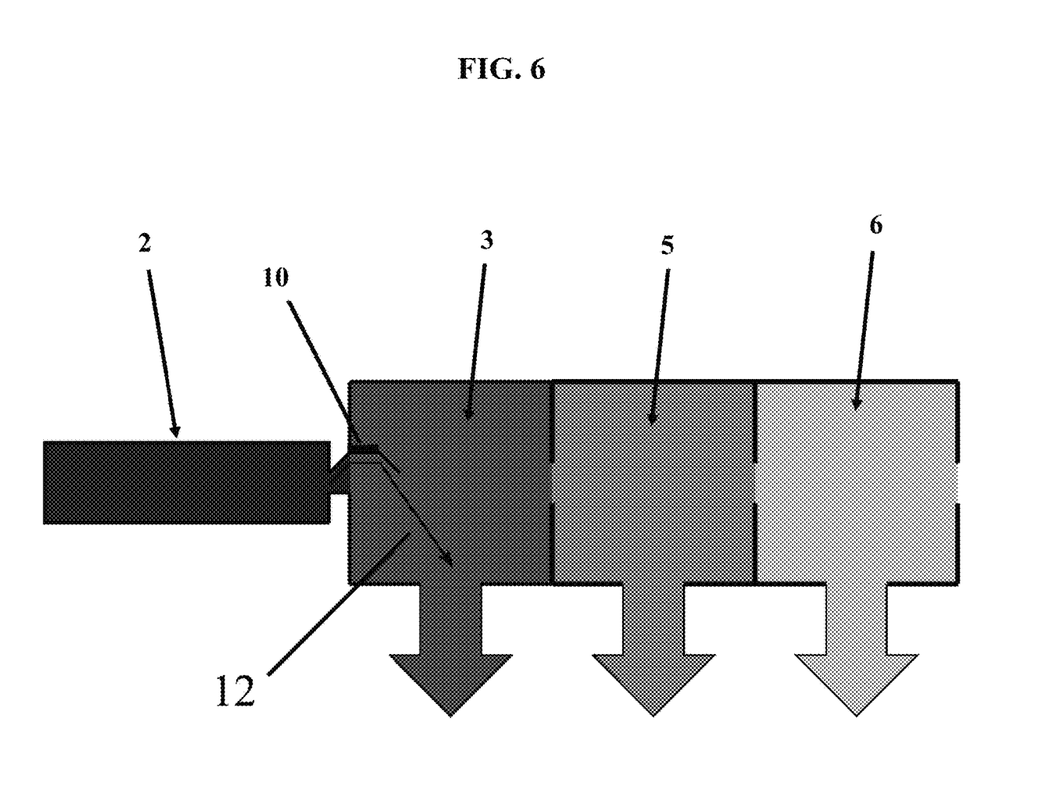
FIG. 6 shows an exemplary schematic of a three-stage differential pumping configuration with an asymmetric aperture and a jet deflector (10) that causes the jetting gas to travel in a different direction (arrow; 12).

FIG. 6 shows an exemplary schematic of a three-stage differential pumping configuration with an asymmetric aperture and a jet deflector component (10) that causes the jetting gas to travel in a different direction (arrow; 12) offset from the vertical axis (beam axis). Boxes (3), (5), and (6) show differential pumping stages. Stage (2) is a higher pressure stage than stages (3), (5), and (6). The addition of the jet deflector component provides additional deflection of the gas jet shown by arrow (12).

Figure 7:
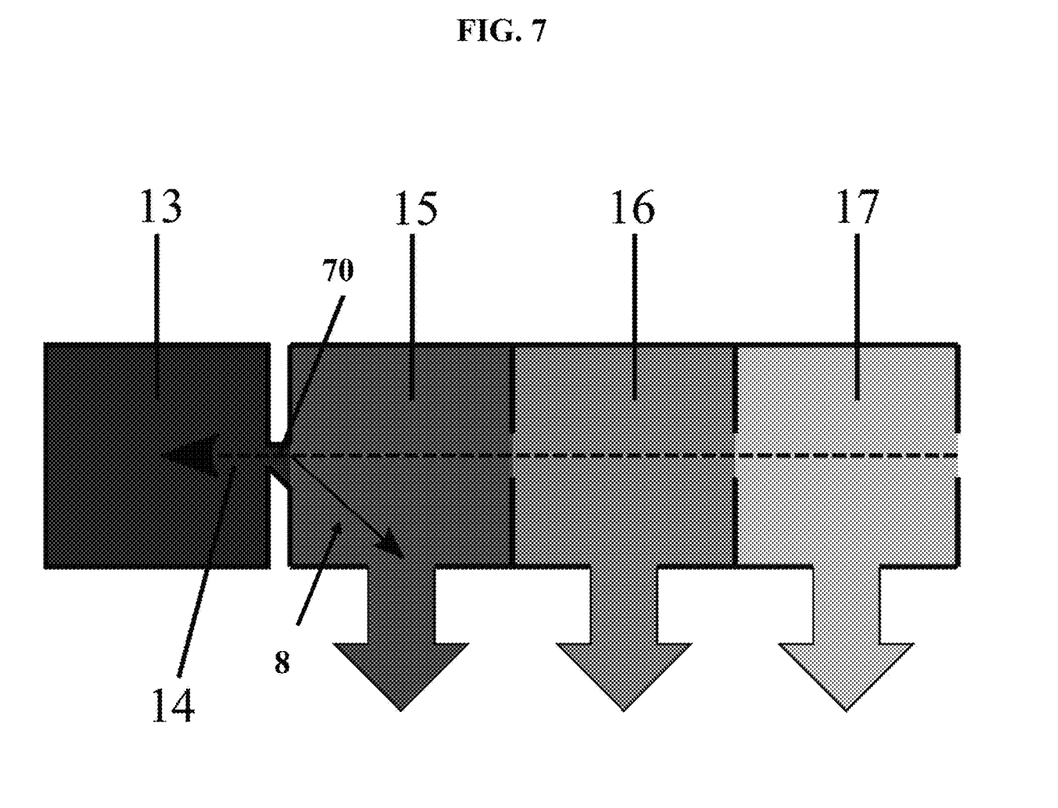
FIG. 7 illustrates the use of a channel (70) with asymmetric aperture (7) for gas jet deflection in particle accelerator applications. The particle beam is shown as dotted line (14).

FIG. 7 illustrates the use of a channel (70) with asymmetric aperture for gas jet deflection in particle accelerator applications. The particle beam is shown as dotted line (14). Using a particle accelerator as shown in this figure, particles are accelerated into a high-pressure gas (or plasma) target (13) of enough length to decelerate the particle beam shown by arrow (14). The pressure in the target is higher than differential pumping stages (15), (16), and (17). The incorporation of a channel (70), with an asymmetric aperture between the target and adjacent differential pumping stage, results in reduced pumping requirements and lower base pressures in stages (15), (16), and (17). The incorporation of a jet deflector component further reduces the gas transport between the target and connected differential stages.

Figure 8:
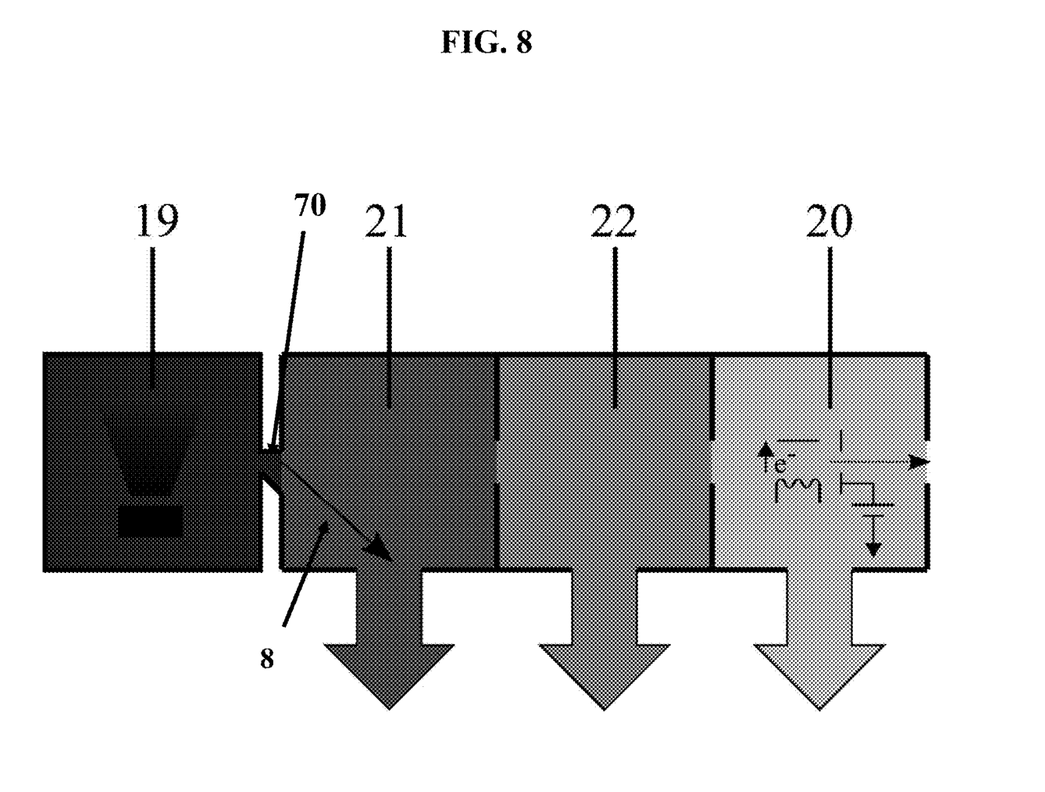
FIG. 8 illustrates the use of a channel with an asymmetric aperture for gas jet deflection in a mass spectrometer.
Figure 9:
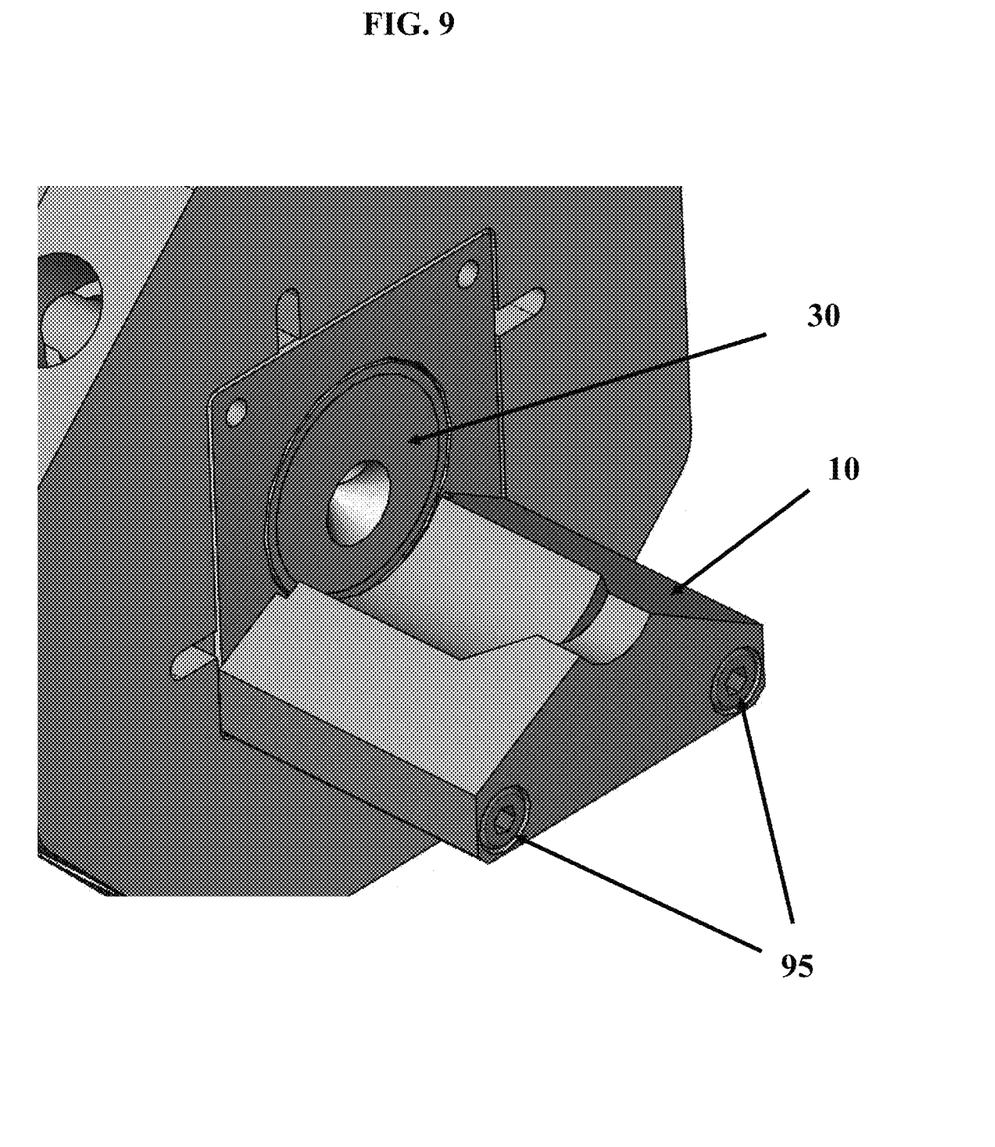
FIG. 9 show an exemplary jet deflector (10) bolted to a gas-deflector plate (30) using bolts (95).
Figure 10:
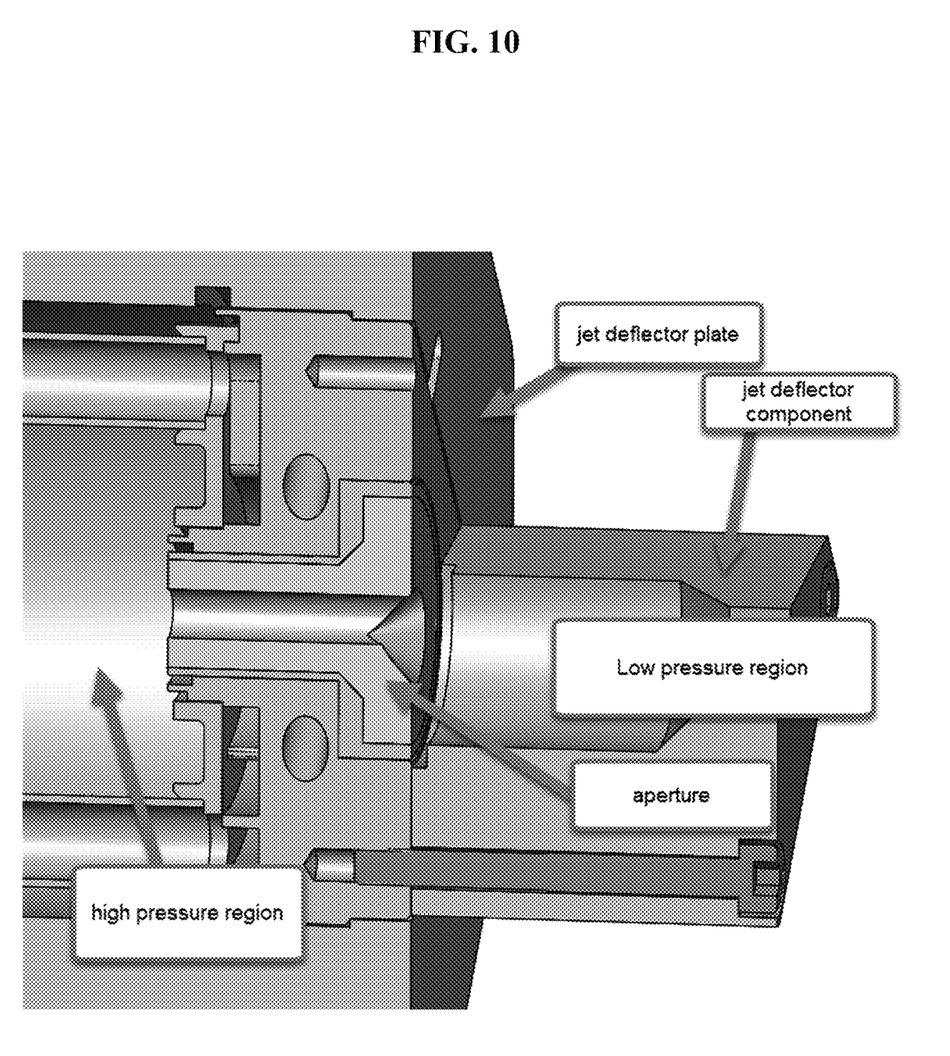
FIG. 10 shows an exemplary gas-deflector plate (30) composed of two parts-an outer housing and an inner replaceable "puck". In certain embodiments, these parts are held in position by other components such that leak paths between the high- and low-pressure regions are minimized.

FIG. 8 illustrates the use of a channel (70) with an asymmetric aperture for gas jet deflection in a mass spectrometer. A mass spectrometer is composed of a sample chamber (19) separated from an ionization chamber (20) by differential pumping stages (21) and (22). An asymmetric aperture located between stages (19) and (21) deflects gas, enabling the sample chamber to operate at a high pressure, the ionization chamber to operate at high-vacuum levels, while generally eliminating the gas jetting phenomenon which would ordinarily result between stages (20), (21), and (22).

We claim:
1. A method comprising:
positioning a gas-deflector plate between a first region and a second region of a pressurizable system; and
activating the pressurizable system such that said pressurizable system becomes pressurized with the first region at a higher pressure than the second region thereby causing jetting gas to move through a channel formed in the gas-deflector plate from the first region to the second region and enter the second region by exiting an asymmetric opening formed in the gas-deflector plate.

2. The method of claim 1, wherein the gas-deflector plate includes a first surface facing the first region, a second surface facing the second region, and the channel extends through the gas-deflector plate with a first opening in the first surface and the asymmetric opening in the second surface.

3. The method of claim 2, wherein the gas-deflector plate has a longitudinal axis and a lateral axis that extends through the gas-deflector plate and are parallel to the first surface and the second surface; and wherein the gas-deflector plate has a vertical axis that is perpendicular to the longitudinal axis and the lateral axis; and wherein gas moving through the channel from the first region to the second region enters the lower pressure region at an angle offset from the vertical axis.

4. The method of claim 3, wherein the angle offset is at least 15 degrees.

5. The method of claim 3, wherein the asymmetric opening is formed from a first portion and a second portion of the channel, wherein the first portion is across the asymmetric opening from the second portion, and wherein the second portion has a greater angular offset from the vertical axis than the first portion.

6. The method of claim 1, wherein no physical component obstructs the jetting gas exiting the channel into the second region.

7. The method of claim 1, further comprising coupling a jet-deflector component to the gas-deflector plate.

8. The method of claim 7, wherein the jet-deflector component is positioned in the second region.

9. The method of claim 8, wherein the jet-deflector component includes a surface; and wherein the gas entering the second region strikes the surface of the jet-deflector component and is re-directed in a different direction.

10. The method of claim 9, wherein the surface has a shape selected from the group of: flat, concave, convex, and textured.

11. The method of claim 7, wherein the jet-deflector component further comprises first attachment components, and wherein the gas deflector plate further comprises second attachment components, and wherein the first attachment components and the second attachment components allow the jet-deflector component to be attached to said gas deflector plate.

12. The method of claim 1, wherein the pressurizable system is selected from the group consisting of: a gas-target particle accelerator, a mass spectrometer, and a windowless delivery port.

13. The method of claim 1, wherein the gas-deflector plate is positioned between a target chamber and a differential pumping system.

14. The method of claim 1, wherein the gas-deflector plate is positioned between a sample chamber and a differential pumping stage.

15. The method of claim 2, wherein the first opening has a diameter of about 6-18 mm.

16. The method of claim 2, wherein the gas-deflector plate has a thickness between the first surface and the second surface of about 13-40 mm.

17. The method of claim 1, wherein the gas-deflector plate has a circular or generally circular shape.

18. The method of claim 1, wherein most or all of the gas-deflector plate is composed of a metal.

19. The method of claim 18, wherein the metal is selected from the group consisting of: copper, tungsten, and stainless steel.

20. The method of claim 1, wherein the gas-deflector plate comprises one or more openings that allow attachment to the first region and/or the second region.

\* \* \* \* \*